United States Patent
Tachiiri

(10) Patent No.: US 10,027,323 B2
(45) Date of Patent: Jul. 17, 2018

(54) MANIPULATION DEVICE

(71) Applicant: DENSO CORPORATION, Kariya, Aichi-pref. (JP)

(72) Inventor: Motoki Tachiiri, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 14/899,497

(22) PCT Filed: Jun. 16, 2014

(86) PCT No.: PCT/JP2014/003179
§ 371 (c)(1),
(2) Date: Dec. 17, 2015

(87) PCT Pub. No.: WO2014/203513
PCT Pub. Date: Dec. 24, 2014

(65) Prior Publication Data
US 2016/0156353 A1 Jun. 2, 2016

(30) Foreign Application Priority Data

Jun. 20, 2013 (JP) ................................. 2013-129596

(51) Int. Cl.
*H03K 17/975* (2006.01)
*G06F 3/0362* (2013.01)
(Continued)

(52) U.S. Cl.
CPC ........... *H03K 17/975* (2013.01); *G05G 9/047* (2013.01); *G06F 3/0338* (2013.01);
(Continued)

(58) Field of Classification Search
CPC .... H03K 17/975; H03K 17/962; G05G 9/047; G06F 3/0338; G06F 3/0354;
(Continued)

(56) References Cited

U.S. PATENT DOCUMENTS

2002/0122683 A1* 9/2002 Kamei ................. G06F 1/1616
400/472
2007/0181410 A1 8/2007 Baier
(Continued)

FOREIGN PATENT DOCUMENTS

| CN | 102402312 A | 4/2012 |
| JP | 2007109649 A | 4/2007 |

(Continued)

OTHER PUBLICATIONS

International Search Report and Written Opinion (in Japanese with English Translation) for PCT/JP2014/003179, dated Jul. 8, 2014; ISA/JP.

*Primary Examiner* — Anthony R. Jimenez
(74) *Attorney, Agent, or Firm* — Harness, Dickey & Pierce, P.L.C.

(57) ABSTRACT

The manipulation device includes: a fixing portion having a fixing surface to be fixed on an object; a moving part that has a moving surface arranged to face the fixing surface and is configured such that the relative position of the moving surface with respect to the fixing surface is manually adjusted; a fixing portion side circuit component that is arranged at the fixing portion; a moving portion side circuit component that is arranged at the moving portion so as not to be in contact with the fixing portion side circuit component, and includes an electric circuit where the impedance as measured from the fixing portion side is a predetermined impedance; and an input portion that is arranged at the moving portion manually operable, and changes the impedance of the electric circuit measured from the fixing portion.

14 Claims, 13 Drawing Sheets

(51) Int. Cl.
*G06F 3/0354* (2013.01)
*G05G 9/047* (2006.01)
*H01H 25/04* (2006.01)
*G06F 3/0338* (2013.01)
*H01H 25/00* (2006.01)
*H03K 17/96* (2006.01)
*H01H 25/06* (2006.01)

(52) U.S. Cl.
CPC .......... *G06F 3/0354* (2013.01); *G06F 3/0362* (2013.01); *G06F 3/03548* (2013.01); *H01H 25/002* (2013.01); *H01H 25/04* (2013.01); *H03K 17/962* (2013.01); *G05G 2009/0474* (2013.01); *G05G 2009/04774* (2013.01); *G05G 2009/04781* (2013.01); *H01H 25/06* (2013.01); *H03K 2217/96054* (2013.01); *H03K 2217/960755* (2013.01)

(58) Field of Classification Search
CPC . G06F 3/03548; G06F 3/0362; H01H 25/002; H01H 25/04; H01H 1/00; H01H 1/12; H01H 1/14; H01H 3/00; H01H 3/02; H01H 3/12; H01H 9/00; H01H 9/02; H01H 9/0264; H01H 13/00; H01H 13/02; H01H 13/04; H01H 13/12; H01H 13/14; H01H 13/20; H01H 13/50; H01H 13/52; H01H 2003/12; H01H 2009/02; H01H 2205/00; H01H 2221/00; H01H 2221/016; H01H 2221/018; H01H 2221/008; H01H 2239/02; H01H 2239/024
USPC ........................................................ 200/5 A
See application file for complete search history.

(56) References Cited

U.S. PATENT DOCUMENTS

| | | |
|---|---|---|
| 2010/0024573 A1 | 2/2010 | Daverman et al. |
| 2011/0102326 A1* | 5/2011 | Casparian ............... G06F 3/016 345/168 |
| 2011/0139517 A1 | 6/2011 | Mizushima |
| 2012/0062460 A1 | 3/2012 | Toyota et al. |
| 2012/0072150 A1 | 3/2012 | Furukawa et al. |
| 2012/0092263 A1* | 4/2012 | Peterson ................ G06F 3/016 345/168 |

FOREIGN PATENT DOCUMENTS

| | | |
|---|---|---|
| JP | 2008092330 A | 4/2008 |
| JP | 2010021118 A | 1/2010 |
| JP | 2011003536 A | 1/2011 |
| JP | 2011023286 A | 2/2011 |
| JP | 2011180950 A | 9/2011 |
| WO | WO-2010026845 A1 | 3/2010 |

* cited by examiner

MANIPULATION DEVICE

CROSS REFERENCE TO RELATED APPLICATIONS

This application is a U.S. National Phase Application under 35 U.S.C. 371 of International Application No. PCT/JP2014/003179 filed on Jun. 16, 2014 and published in Japanese as WO 2014/203513 A1 on Dec. 24, 2014. This application is based on and claims the benefit of priority from Japanese Patent Application No. 2013-129596 filed on Jun. 20, 2013. The entire disclosures of all of the above applications are incorporated herein by reference.

TECHNICAL FIELD

The present disclosure relates to a manipulation device which can input a desired command by slide manipulation of a moving portion and manipulation of an input portion provided in the moving portion.

BACKGROUND ART

In the related art, a manipulation device which is configured to include a manipulation knob that can perform slide manipulation and rotating manipulation, and an electrostatic switch provided in the operating knob, and to input various commands by the manipulation of the manipulation knob and the manipulation of the electrostatic switch is known as a manipulation device which manipulates an onboard device, such as a navigation device. (for example, refer to Patent Literature 1).

The manipulation device is provided with a jog switch which generates a signal corresponding to a sliding position and a rotating position of the manipulation knob, and can function as a pointing device by the jog switch and the electrostatic switch.

PRIOR ART LITERATURES

Patent Literature

Patent Literature 1: JP-2010-21118-A

SUMMARY OF INVENTION

However, since the manipulation device in the above-described related art is provided with a switch in the manipulation knob which is relatively displaced with respect to a fixing portion fixed to an installation target, it is necessary to provide a signal line which transfers the signal from the switch to the fixing portion side.

However, since the signal line moves in accordance with the manipulation of the manipulation knob when the signal line is provided between the manipulation knob which is a moving portion and the fixing portion, there is a problem that the manipulation feeling of the manipulation knob deteriorates. In addition, there is also a problem that the signal line gradually deteriorates by the movement according to the manipulation of the manipulation knob, and durability of the manipulation device deteriorates.

In consideration of the problem, an object of this disclosure is to make it possible to transfer a manipulation signal from a manipulation portion to a fixing portion side without deterioration of manipulation feeling of a moving portion and the durability of a device in a manipulation device which is provided with the moving portion that can perform slide manipulation such as manipulation knob, and the manipulation portion for manual manipulation in the moving portion.

In the manipulation device of this disclosure, by providing the fixing portion which is fixed to a predetermined attachment target, and the moving portion which has a moving surface disposed to oppose a fixing surface of the fixing portion, and by performing the slide manipulation with respect to the moving portion, a relative position of the moving surface with respect to the fixing surface can be manually adjusted.

For this reason, similarly to the device of the above-described related art, by connecting the moving portion to the pointing device, such as a joy stick, the signal corresponding to the relative position (that is, an offset position of the moving portion with respect to the fixing portion) of the moving surface with respect to the fixing surface can be generated.

In addition, in each of the fixing portion and the moving portion, circuit components which configure an electric circuit in which an impedance measured from the fixing portion side becomes a predetermined impedance are provided not to be in contact with each other. In the moving portion, an input portion which changes the impedance measured from the fixing portion side of the electric circuit by the manual manipulation is provided.

For this reason, according to the manipulation device of this disclosure, the manipulation input from the input portion can be transferred to the fixing portion side in a non-contact state, and similarly to the related art, it is not necessary to provide the signal line for transferring the manipulation signal from the input portion between the moving portion and the fixing portion.

Therefore, according to the manipulation device of this disclosure, compared to the device in the related art, the manipulation feeling of the moving portion can be improved, and the durability of the manipulation device can be improved.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
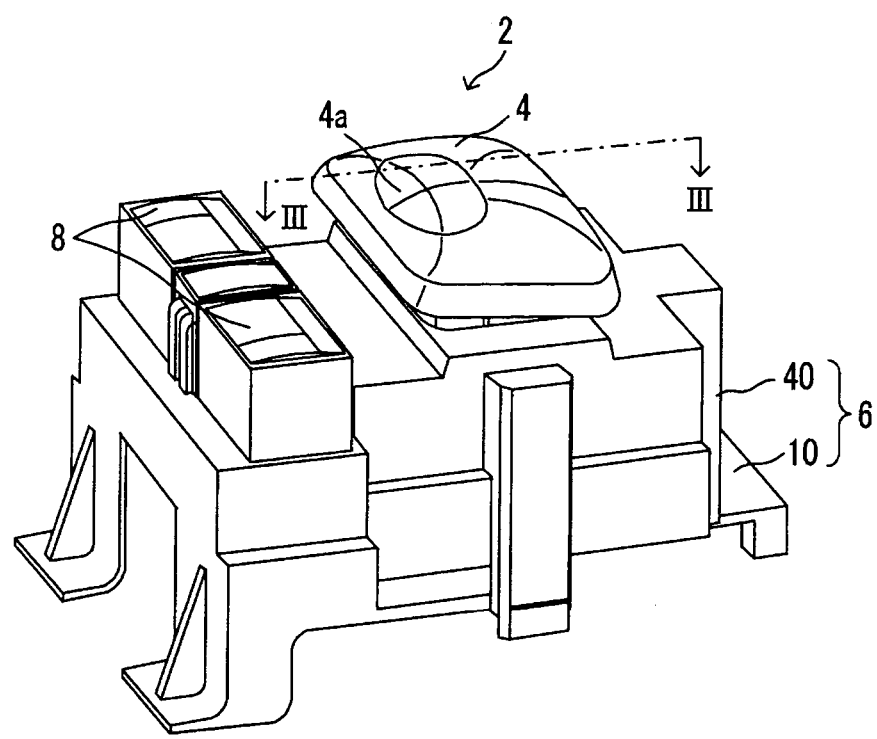
FIG. 1 is a perspective view illustrating an external appearance of a manipulation device of a first embodiment.

Hereinafter, the embodiments of this disclosure will be described with reference to the drawings.

This disclosure is not interpreted being limited to any of the following embodiments. An aspect in which a part of a configuration of the following embodiments is omitted within the range where the problem can be solved is also an embodiment of this disclosure. An aspect which can be considered without departing the essence of this disclosure specified only by the words described in the range of the appended claims is also an embodiment of this disclosure. The reference numerals which are used in the description of the following embodiment are also appropriately used within the range of the appended claims. However, the reference numerals are used for making it easy to understand this disclosure, and the technical range of this disclosure is not limited thereto.

First Embodiment

A manipulation device 2 of this embodiment is provided in a center console or the like of a vehicle, and is used in manipulating an electronic device, such as a navigation device.

As illustrated in FIG. 1, the manipulation device 2 includes a manipulation knob 4 for a user (a driver or the like) to put a hand and perform the manipulation, and a device main body 6 which supports the manipulation knob 4 to be manipulated, and fixes the manipulation knob 4 to the center console or the like which is a setting target.

Figure 2:
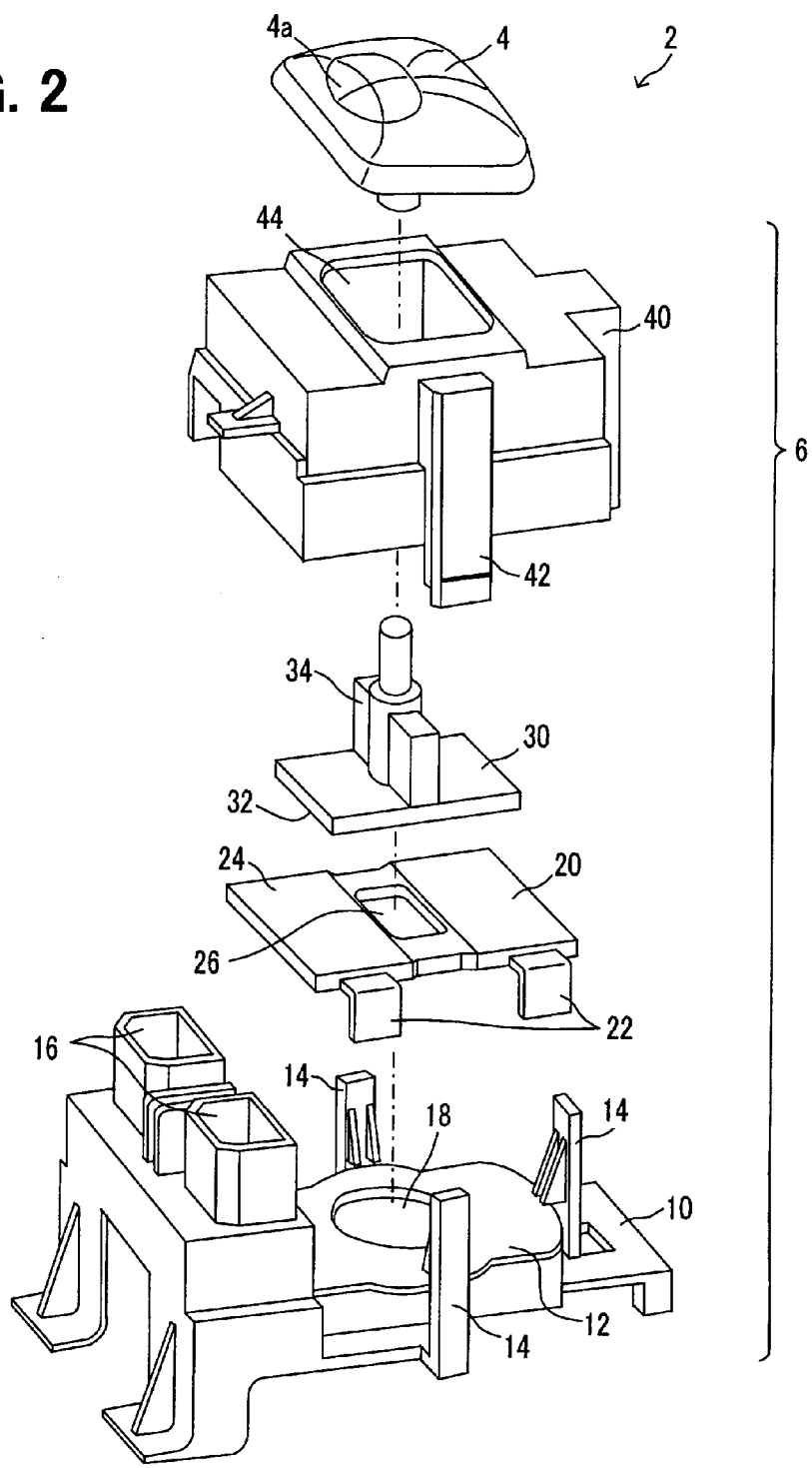
FIG. 2 is an exploded perspective view of the manipulation device of the first embodiment.

As illustrated in FIG. 2, the device main body 6 includes a base platform 10, and a cover 40 which covers the base platform 10. Inside the device main body 6, a base 20 having a fixing surface 24, and a moving surface 32 disposed to oppose the fixing surface 24 of the base 20 are provided, and a slider 30 which can move in a direction of a surface is accommodated.

Each of the portions is configured of a non-conductive material, such as a synthesized resin, except for a circuit component, such as an electrode or a signal line, which will be described later.

A flat base placing portion 12 for placing the base 20, and an engagement piece 14 which is engaged with three locations in the vicinity of the base 20 placed on the base placing portion 12, and positions and fixes the base 20 onto the base placing portion 12, are provided on the base platform 10.

On the base platform 10, on one end side (front side of a vehicle) of the base placing portion 12, a manipulation switch mounting portion 16 is also provided for mounting a manipulation switch 8 (refer to FIG. 1) for occupants of the vehicle to perform manipulation.

Next, the base 20 is formed in a shape of a plate to be capable of being placed on the base placing portion 12, and in the vicinity thereof, an engagement projection 22 for being engaged with the vicinity of the base placing portion 12, and for positioning the base 20 on the base platform 10, is provided.

For this reason, the base 20 is firmly fixed onto the base placing portion 12 as the engagement projection 22 is engaged with the vicinity of the base placing portion 12, and the engagement piece 14 of the base placing portion 12 is engaged at three locations of the vicinity of the base 20 when being placed on the base placing portion 12.

A plate surface (upper surface) on a side opposite to the base placing portion 12 of the base 20 is the fixing surface 24 which supports the slider 30 to be capable of relatively moving in the direction of the surface. At the center thereof, a through hole 26 for inserting an input member (in this embodiment, a manipulation lever 52 of a joy stick 50 illustrated in FIG. 3) into the pointing device provided on the vehicle side is formed. In addition, a similar through hole 18 is also formed on the base platform 10.

Next, the slider 30 is formed in a shape of a plate having a size which can be slid along the fixing surface 24 of the base 20, and the moving surface 32 which is one surface of the slider 30 nips a spacer 36 (refer to FIG. 3), and is disposed to oppose the fixing surface 24 of the base 20.

On a plate surface on a side opposite to the moving surface 32 of the slider 30, a linking portion 34 for being linked to the manipulation knob 4 protrudes. For this reason, when the manipulation knob 4 is connected to the linking portion 34, and the manipulation knob 4 is moved along the fixing surface 24 of the base 20, the slider 30 can be slid along the fixing surface 24.

Figure 3:
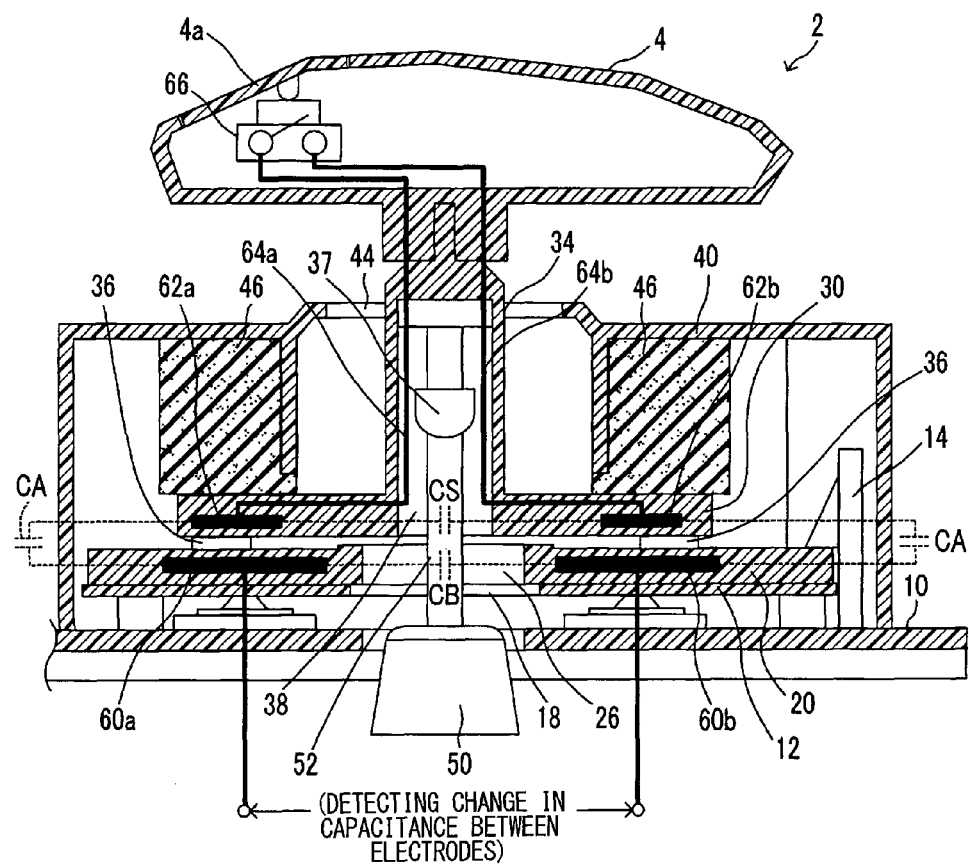
FIG. 3 is a cross-sectional view illustrating a sectional surface cut along line III-III of the manipulation device illustrated in FIG. 1.

As illustrated in FIG. 3, a linking hole 38 for inserting the manipulation lever 52 of the joy stick 50 thereto from the moving surface 32 side, and for fixing one end thereof to be oscillated to the linking portion 34 via a bearing 37, is formed in the linking portion 34.

Next, in a state where the base 20 is fixed to the base platform 10, and the slider 30 is disposed on the fixing surface 24 of the base 20, the cover 40 is fixed to the base platform 10 to cover each portion, and is formed in a shape of a box of which a bottom portion is opened. In addition, on an opening end side of the bottom portion, a fixing projection 42 for fixing the cover 40 to the base platform 10 protrudes.

On the cover 40, when the cover 40 is fixed to the base platform 10, in order to make it possible to link the linking portion 34 of the slider 30 and the manipulation knob 4, a through hole 44 which allows the linking portion 34 of the slider 30 to protrude to the outside of the cover 40 is formed.

The size of the through hole 44 is set so that the linking portion 34 does not hit an inner wall of the through hole 44 due to the manipulation (movement) of the manipulation knob 4.

Inside the cover 40, a spacer 46 which prevents the slider 30 from being biased to the base 20 side, and from floating from the fixing surface 24, is provided (refer to FIG. 3).

According to the manipulation device 2 of this embodiment configured in this manner, as the user moves the manipulation knob 4, the slider 30 can be moved in the direction of the surface of the moving surface 32.

By the movement, the joy stick 50 which is a pointing device can be manipulated, and a signal corresponding to a relative position of the slider 30 with respect to the base 20 can be generated from the joy stick 50.

Next, above the manipulation knob 4, a manipulation portion 4a for the user to perform manipulation (pressing) by the fingers is provided. Inside the manipulation knob 4, as the manipulation portion 4a is manipulated (pressed), a contact point is closed and an input switch 66 which is in an ON state is provided (refer to FIG. 3).

The input switch 66 is for performing manual switching whether or not to connect one pair of electrodes 62a and 62b provided in the slider 30 to each other.

In other words, as illustrated in FIG. 3, in each of the base 20 and the slider 30, two pairs of electrodes 60a and 62a, and 60b and 62b which have a shape of a flat plate are buried to oppose each other when the slider 30 is placed on the base 20.

The electrodes 62a and 62b provided in the slider 30 are connected to each contact point of the input switch 66 via signal lines 64a and 64b that pass through the linking portion 34.

For this reason, by manipulating the manipulation portion 4a, and making the input switch 66 ON, the user can change an electrostatic capacity (that is, impedance) measured from the electrodes 60a and 60b on the base 20 side that become fixed electrodes.

Figure 4:
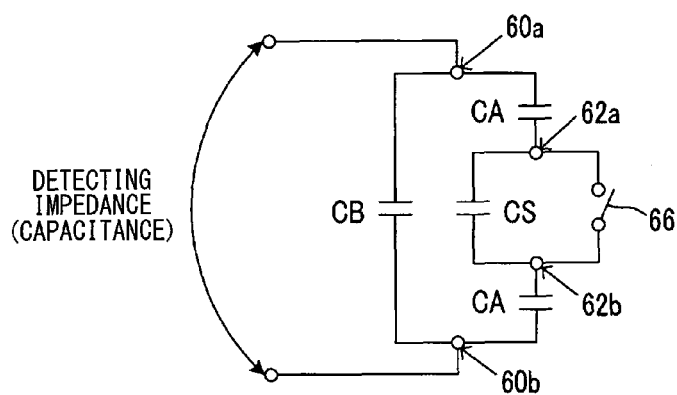
FIG. 4 is a circuit diagram illustrating an equivalent circuit of the manipulation device of the first embodiment.

In other words, when each electrostatic capacity between the electrodes 60a and 60b on the base 20 side, and the electrodes 62a and 62b on the slider 30 side is referred to as CA, an electrostatic capacity between the electrodes 60a and 60b on the base 20 side is referred to as CB, and an electrostatic capacity between the electrodes 62a and 62b on the slider 30 side is referred to as CS, an equivalent circuit inside the manipulation device 2 can be described as illustrated in FIG. 4.

Since the input switch 66 is provided between the electrodes 62a and 62b on the slider 30 side, when the input switch 66 is ON, a part of the electrostatic capacity CS becomes short-circuited.

Therefore, an electrostatic capacity Coff when the input switch 66 is OFF measured from the electrodes 60a and 60b on the base 20 side becomes:

$$Coff = CB + 1/\{(1/CA) + (1/CA) + (1/CS)\},$$

and an electrostatic capacity Con when the input switch 66 is ON becomes:

$$Con = CB + 1/\{(1/CA) + (1/CA)\}.$$

For this reason, as illustrated in FIG. 3, when the signal lines are drawn out from the electrodes 60a and 60b on the base 20 side, and a change of the electrostatic capacity (or impedance) between the electrodes 60a and 60b on the vehicle side is detected, whether or not the user manipulated the manipulation portion 4a can be detected.

According to this embodiment, in order to detect a manipulation state of the manipulation portion 4a provided in the manipulation knob 4 on the vehicle side, it is not necessary to connect the signal lines between the manipulation knob 4 or the slider 30 which is the moving portion of the manipulation device 2, the base platform 10 which is the fixing portion, and the base 20 or the cover 40.

Therefore, according to the manipulation device 2 of this embodiment, when the user manipulates the manipulation knob 4, and relatively moves the slider 30 with respect to the base, a force is applied to the manipulation knob 4 from the signal line, and deterioration of manipulation properties can be prevented. In addition, since the signal line does not move and deteriorate due to the manipulation of the manipulation knob 4, the durability of the manipulation device 2 can be improved.

First Modification Example

In this embodiment, the electrodes 60a and 60b are provided on the base 20 on which the slider 30 is placed, but the electrodes 60a and 60b may be provided on the fixing portion side and perform capacity coupling with respect to the electrodes 62a and 62b provided in the slider 30 which is the moving portion.

Figure 5:
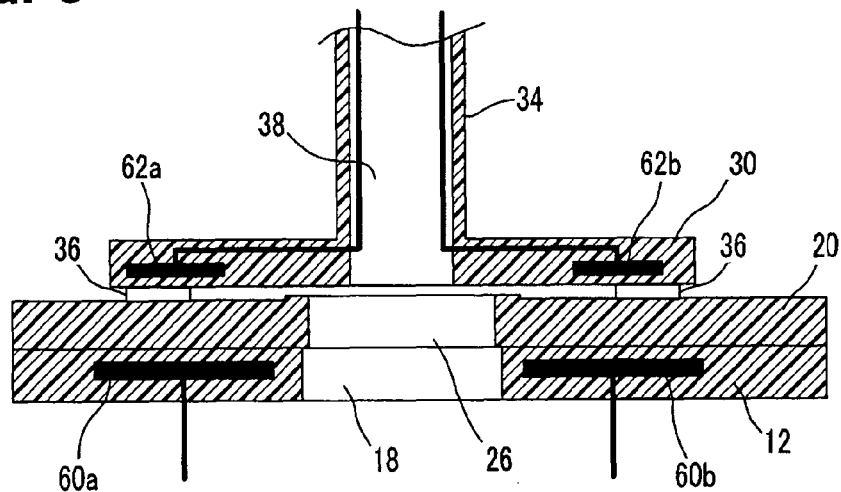
FIG. 5 is a cross-sectional view illustrating First Modification Example of the manipulation device of the first embodiment.

For this reason, for example, as illustrated in FIG. 5, the electrodes 60a and 60b may be provided on the base placing portion 12 of the base platform 10.

In other words, between the electrodes 62a and 62b on the moving portion side, and the electrodes 60a and 60b on the fixing portion side, a member which is different from the member provided with each of the electrodes may be disposed.

Second Modification Example

Figure 6:
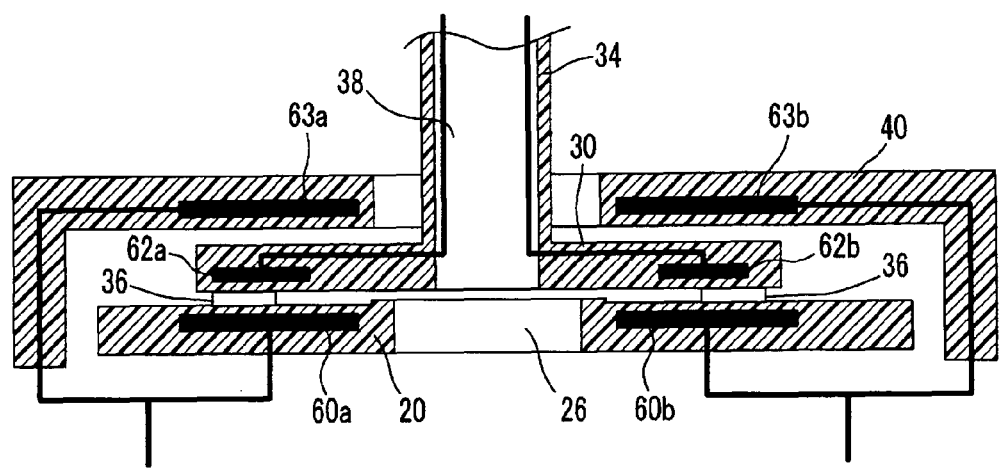
FIG. 6 is a cross-sectional view illustrating Second Modification Example of the manipulation device of the first embodiment.

For example, as illustrated in FIG. 6, electrodes 63a and 63b having the same potential as that of each of the electrodes 60a and 60b may be provided as electrodes on the fixing portion side, in addition to the electrodes 60a and 60b provided on the base 20. The electrodes 62a and 62b on the slider 30 side may be disposed between the electrodes 60a and 63a, and between the electrodes 60b and 63b.

In this case, as illustrated in FIG. 6, the electrodes 63a and 63b may be provided on the cover 40, or the spacer 46 (refer to FIG. 3) provided between the cover 40 and the slider 30 may be provided.

Third Modification Example

In this embodiment, one input switch 66 is provided as an input portion for changing the electrostatic capacity (impedance) by external manipulation in the manipulation knob 4, but by providing multiple switches, the electrostatic capacity (impedance) between the electrodes 60a and 60b may be gradually changed.

Figure 7:
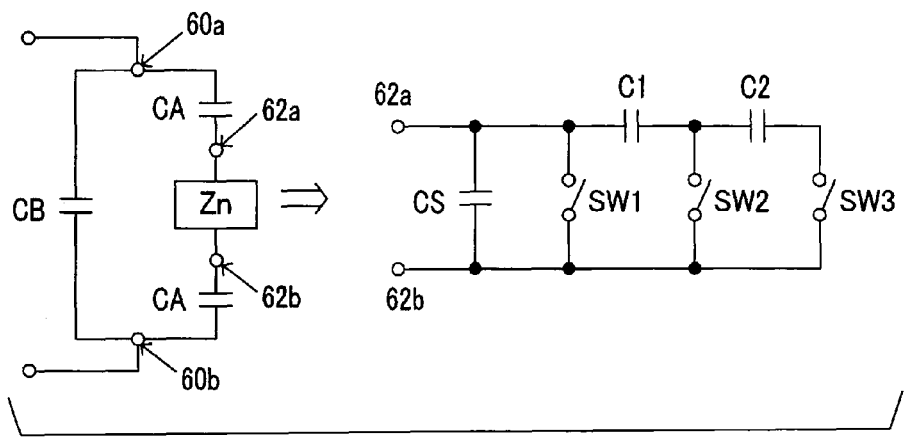
FIG. 7 is a circuit diagram illustrating Third Modification Example of the manipulation device of the first embodiment.

In other words, for example, as illustrated in FIG. 7, three switches SW1, SW2, and SW3 are provided as input switches which can perform manual manipulation via the manipulation portion in the manipulation knob 4. The switches SW1, SW2, and SW3 are connected to each other in a shape of a ladder via impedance elements (capacitors C1 and C2 in FIG. 7), such as a resistor, a capacitor, or an inductor, between the electrodes 62a and 62b.

As a result, as the user selectively manipulates one of the three switches SW1, SW2, and SW3, an impedance Zn between the electrodes 62a and 62b can be gradually changed.

In this case, multiple commands can be input to the vehicle side via the multiple switches provided in the manipulation knob 4, and application of the manipulation device 2 can be expanded.

Second Embodiment

Next, a second embodiment of this disclosure will be described.

In the manipulation device 2 of this embodiment, the base platform 10 which is the fixing portion, the base 20, and the cover 40 are configured similarly to that of the first embodiment, and the configuration of the manipulation knob 4 which is the moving portion and the slider 30 are different from that of the first embodiment.

In this embodiment, parts which are different from those in the first embodiment will be descried, and description of a similar configuration to that of the first embodiment will be omitted.

Figure 8:
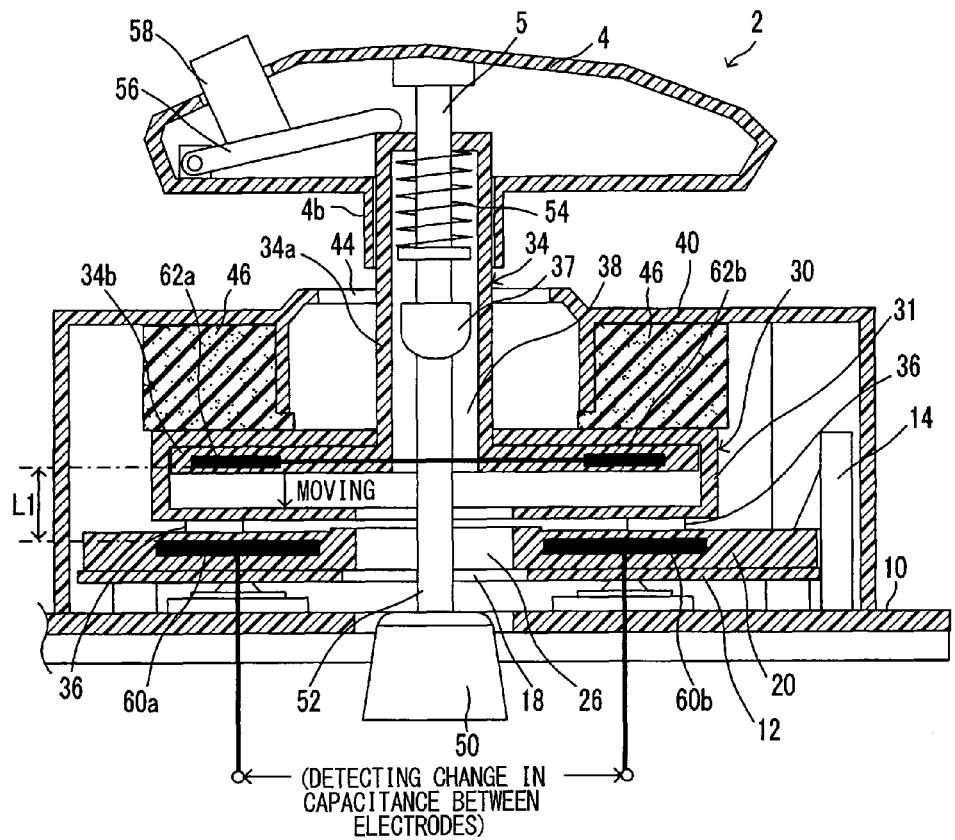
FIG. 8 is a cross-sectional view illustrating a configuration of a manipulation device of a second embodiment.

As illustrated in FIG. 8, in this embodiment, in the slider 30, the linking portion 34 and a slider main body 31 are configured separately.

The linking portion 34 includes a rod-shaped main body portion 34a of which a tip end is linked to the manipulation knob 4, and a sleeve portion 34b which is formed to stretch out in a direction orthogonal to a center axis of the main body portion 34a at a lower end (specifically, an end portion on a side opposite to the manipulation knob 4) of the main body portion 34a.

The electrodes 62a and 62b on the slider 30 side are provided in the sleeve portion 34b. In the linking portion 34, similarly to the above-described embodiment, the linking hole 38 is formed.

In contrast to this, the slider main body 31 is placed to be relatively movable with respect to the base 20, but in this embodiment, the slider main body 31 is formed in a shape of a flat hollow box. In the hollow portion, the sleeve portion 34b of the linking portion 34 is accommodated to be movable in a direction of the center axis of the linking portion 34.

Meanwhile, in the manipulation knob 4, a cylindrical guide portion 4b for inserting the main body portion 34a of the linking portion 34 to be slidable in the direction of the center axis is formed. In addition, inside the linking hole 38 of the linking portion 34, a linking rod 5 which is connected to the manipulation lever 52 of the joy stick 50 via the bearing 37 is provided.

The linking rod 5 protrudes to the outside from an upper end of the linking portion 34 (specifically, the main body portion 34a), and when the linking portion 34 is inserted into the guide portion 4b of the manipulation knob 4, the linking rod 5 can be fixed to the manipulation knob 4.

Inside the linking hole 38 of the linking portion 34, a spring 54 of which one end is fixed to the linking rod 5, and which biases the linking portion 34 to the manipulation knob 4 side is provided.

Inside the manipulation knob 4, a pressing lever 56 for pressing the tip end of the linking portion 34 inserted into the guide portion 4b downward against a basing force of the spring 54, and a manipulation projection 58 for pressing the pressing lever 56 by the manual manipulation, are provided.

According to the manipulation device 2 of this embodiment configured in this manner, when the manipulation projection 58 is not manipulated, as the linking portion 34 is biased to the manipulation knob 4 side by the spring 54, the sleeve portion 34b of the linking portion 34 abuts against an inner wall surface on the manipulation knob 4 side of the slider main body 31.

In contrast to this, when the manipulation projection 58 is manipulated by the user, and the pressing lever 56 is pressed against the biasing force of the spring 54, the sleeve portion 34b of the linking portion 34 moves downward inside the hollow portion of the slider main body 31.

As a result, an interval L1 between the electrodes 62a and 62b on the slider 30 side, and the electrodes 60a and 60b on the base 20 side is long when the manipulation projection 58 is not manipulated, and is short when the manipulation projection 58 is manipulated. In addition, by a change of the interval L1, the electrostatic capacity between the electrodes 60a and 62a, and between the electrodes 60b and 62b changes.

In this embodiment, as the electrodes 62a and 62b on the slider 30 side is connected by a conductive line to have the same potential, and the signal lines are drawn out from the electrodes 60a and 60b on the base 20 side, the change of the electrostatic capacity (or impedance) between the electrodes 60a and 60b can be detected on the vehicle side.

Therefore, even in this embodiment, between the manipulation knob 4 or the slider 30 which is the moving portion of the manipulation device 2, the base platform 10 which is the fixing portion, and the base 20 or the cover 40, the connection is not performed by the signal lines, whether or not the user manipulated the manipulation projection 58 provided in the manipulation knob 4 can be detected on the vehicle side, and similar effects to those of the first embodiment can be obtained.

Third Embodiment

Next, a third embodiment of this disclosure will be described.

Figure 9:
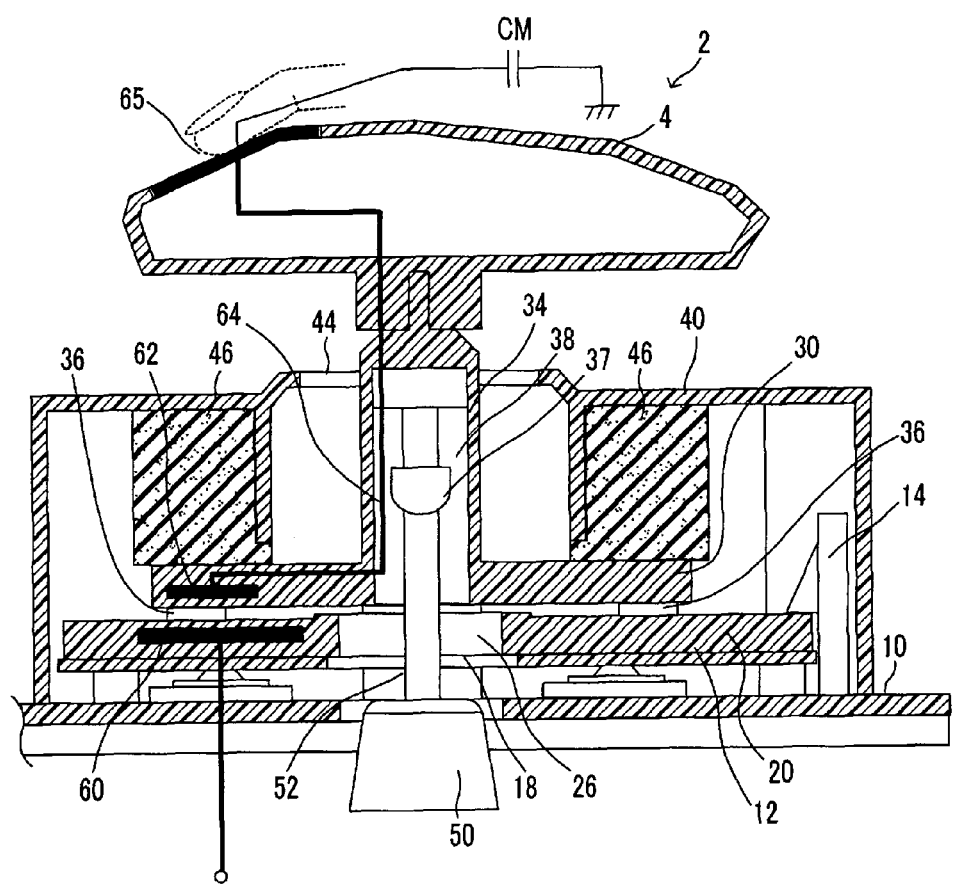
FIG. 9 is a cross-sectional view illustrating a configuration of a manipulation device of a third embodiment.

As illustrated in FIG. 9, the manipulation device 2 of this embodiment is substantially similarly configured to that described in the first embodiment, and is different from the first embodiment in that one pair of electrodes 60 and 62 disposed corresponding each other are provided on the base 20 and the slider 30, and a manipulation electrode 65 is provided on an upper surface of the manipulation knob 4.

The manipulation electrode 65 changes the impedance measured from the electrode 60 side of the base 20 as the user touches the manipulation electrode 65 by hand, and is connected to the electrode 62 provided in the slider 30 via a signal line 64.

In other words, in the manipulation device 2 of this embodiment, since the electrode 62 inside the slider 30 is in an opened state when the user does not touch the manipulation electrode 65, the impedance measured from the electrode 60 side of the base 20 becomes the maximum value (infinite).

In contrast to this, since the electrode 62 inside the slider 30 is grounded via the user's own electrostatic capacity CM when the user touches the manipulation electrode 65, the impedance measured from the electrode 60 side of the base 20 deteriorates.

Therefore, in the manipulation device 2 of this embodiment, for example, if the impedance (or electrostatic capacity) on the electrode 60 side is detected by drawing out the signal line from the electrode 60 on the base 20 side, inputting a high frequency signal to the signal line, and detecting a reflected wave from the electrode 60, whether or not the user manipulated the manipulation electrode 65 provided in the manipulation knob 4 can be detected on the vehicle side.

For the detection, since it is not necessary to perform the connection via the signal line between the manipulation knob 4 or the slider 30 which is the moving portion of the manipulation device 2, the base platform 10 which is the fixing portion, and the base 20 or the cover 40, similar effects to those of the above-described embodiment can be obtained.

Fourth Embodiment

Next, a fourth embodiment of this disclosure will be described.

Figure 10:
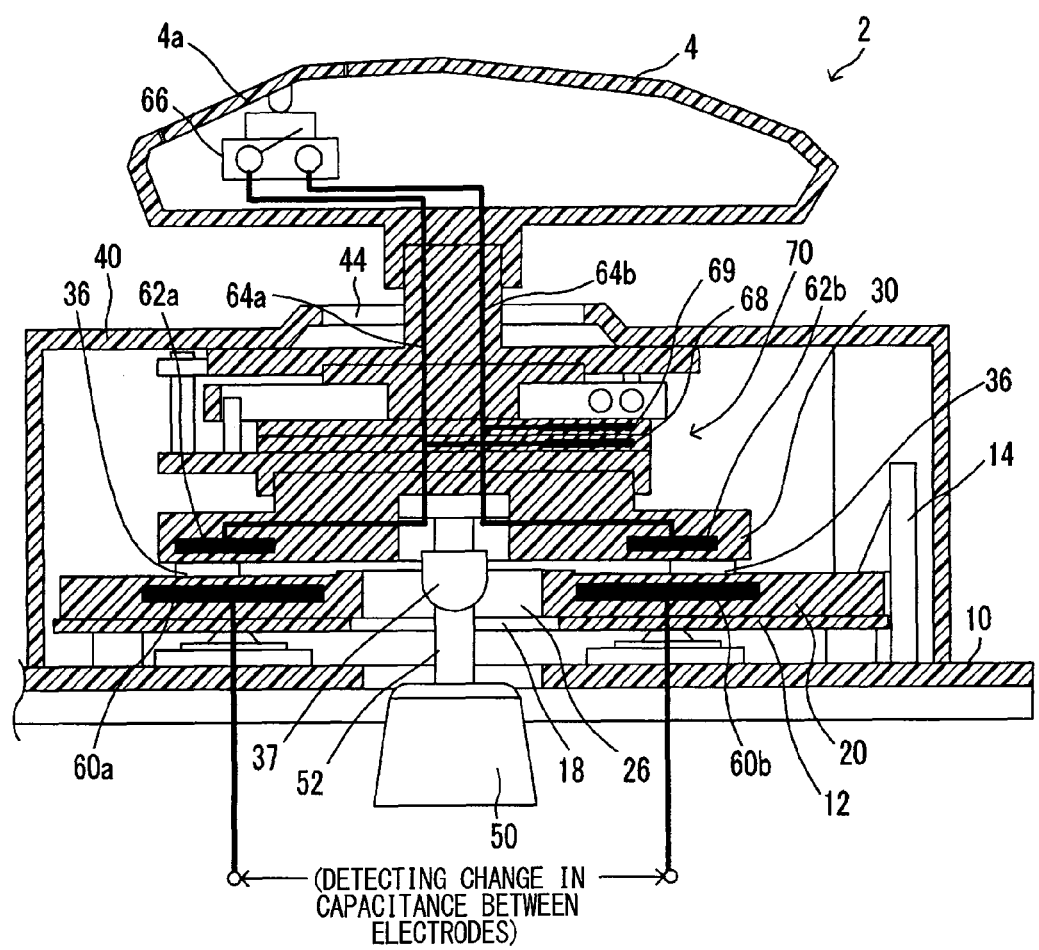
FIG. 10 is a cross-sectional view illustrating a configuration of a manipulation device of a fourth embodiment.

As illustrated in FIG. 10, the manipulation device 2 of this embodiment is substantially similarly configured to that described in the first embodiment, and is different from the first embodiment in that the slider 30 is not directly connected to the manipulation knob 4, and a rotating mechanism 70 is provided between the slider 30 and the manipulation knob 4 so that the rotating manipulation (that is, twisting manipulation) can be performed with respect to the manipulation knob 4.

In the description below, a configuration of the rotating mechanism 70 will be described by using FIGS. 11 to 13C in detail, and detailed description of other configurations will be omitted.

Figure 11:
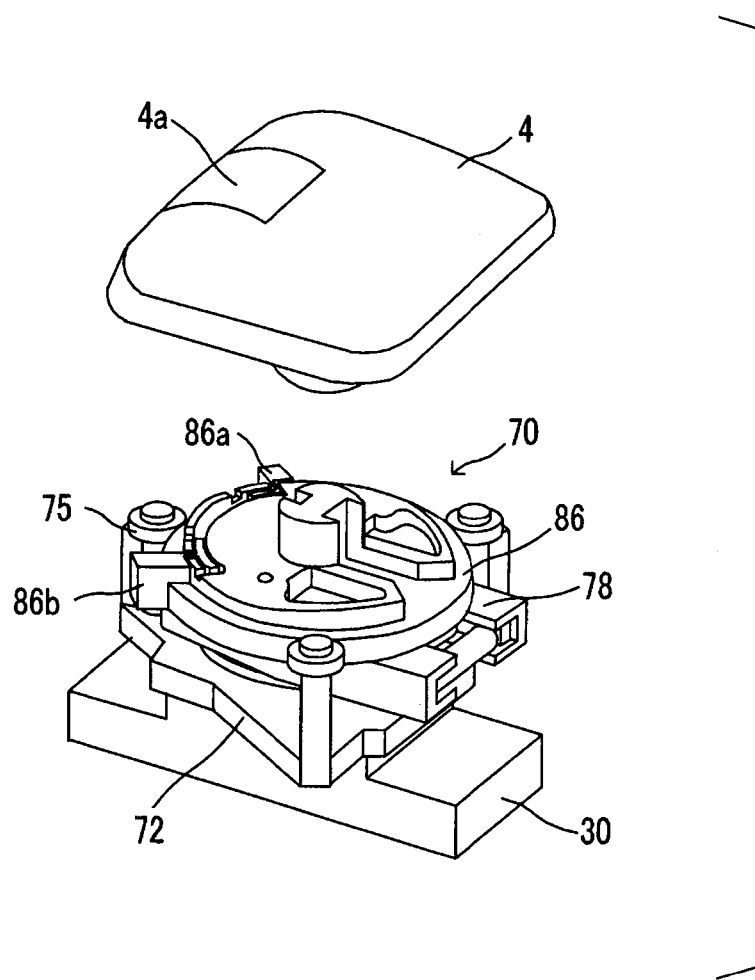
FIG. 11 is a perspective view illustrating a configuration of a moving portion of the fourth embodiment.
Figure 12:
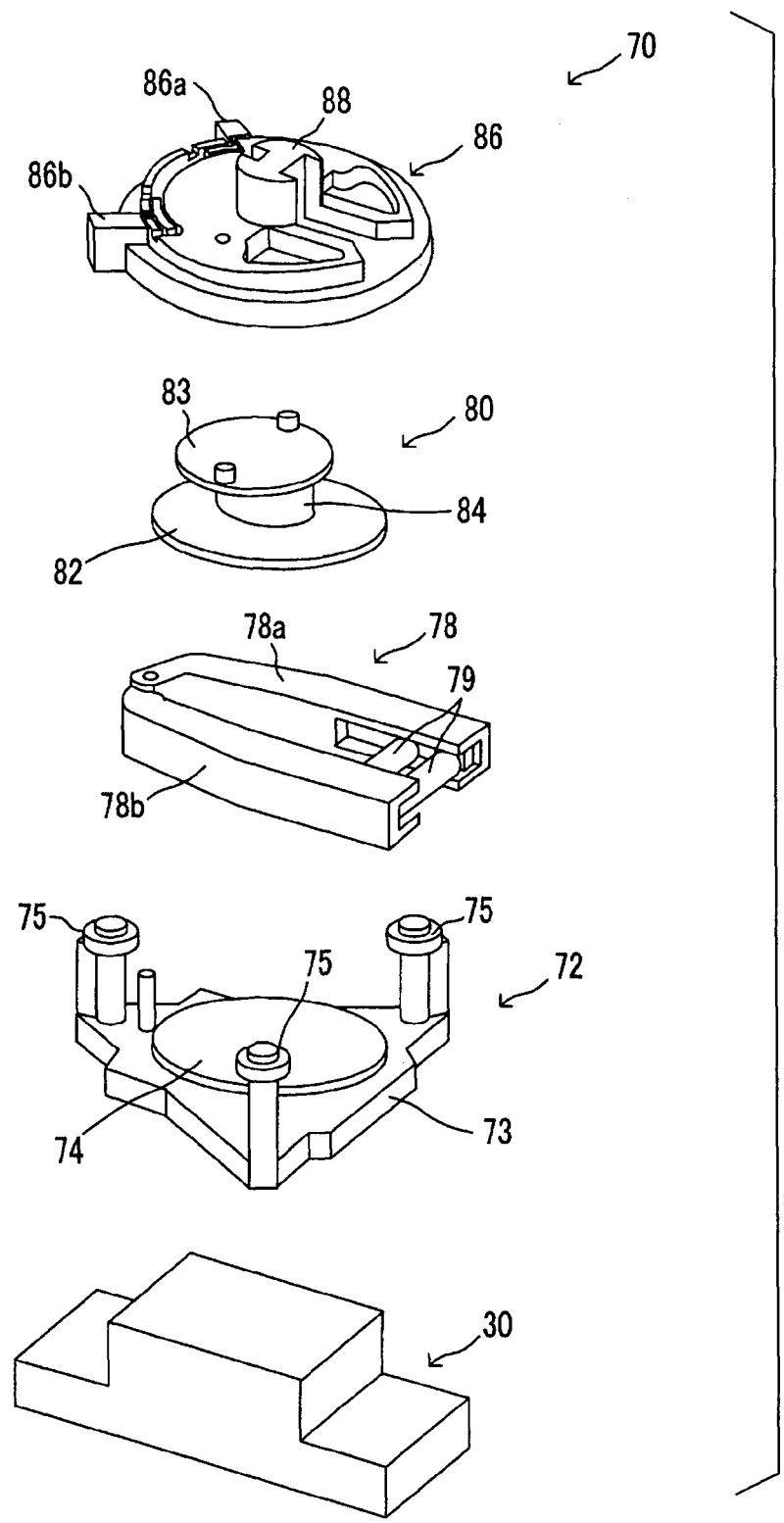
FIG. 12 is an exploded perspective view illustrating a configuration of a rotating mechanism illustrated in FIG. 11.

As illustrated in FIGS. 11 and 12, the rotating mechanism 70 is configured of a rotating base platform 72, a rotating supporting tool 78, a rotating transfer tool 80, and a knob linking tool 86.

The rotating base platform 72 is fixed to a surface on a side opposite to the base 20 of the slider 30, transfers the movement of the manipulation knob 4 in a direction of the moving surface to the slider 30, and includes a plate-shaped knob base 73 fixed to the slider 30, and a base electrode portion 74 disposed substantially parallel to the knob base 73.

Figure 13A:
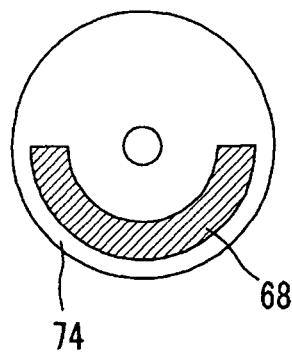
FIG. 13A is a view illustrating a configuration of a base electrode portion provided in the rotating mechanism.

As illustrated in FIG. 13A, the base electrode portion 74 is formed in a shape of a substantial disk, and an arc-shaped electrode 68 is buried around the center axis.

Next, the rotating supporting tool 78 is provided with one pair of arms 78a and 78b linked to each other of which one end is rotatable, and a spring 79 which performs biasing so that an opening angle formed by the arms 78a and 78b becomes the minimum by connecting the other ends of the one pair of arms 78a and 78b to each other.

The rotating transfer tool 80 is provided with a plate-shaped rotating electrode portion 82 disposed to oppose the base electrode portion 74, a linking plate 83 which is linked to the manipulation knob 4 via the knob linking tool 86, and a connection portion 84 which connects plate surfaces of each portion to each other.

The shape of a sectional surface of the connection portion 84 corresponds to the shape of the long opening formed by the arms 78a and 78b of the rotating supporting tool 78, and has an elliptical shape.

The rotating transfer tool 80 is mounted on the rotating supporting tool 78 by making the opening of the rotating supporting tool 78 opened, and accommodating the connection portion 84 in the opening portion. In other words, the rotating transfer tool 80 is mounted on the rotating supporting tool 78 to nip each of the arms 78a and 78b of the rotating supporting tool 78 between the rotating electrode portion 82 and the linking plate 83.

For this reason, when the linking plate 83 of the rotating transfer tool 80 is rotated around the center axis in a state where the rotating transfer tool 80 is mounted on the rotating supporting tool 78, the arms 78a and 78b of the rotating supporting tool 78 are opened against the biasing force of the spring 79. In this state, if the user takes off the hand from the rotating transfer tool 80, the arms 78a and 78b are closed due to the biasing force of the spring 79, and the rotating transfer tool 80 returns to an original reference rotating position.

Figure 13B:
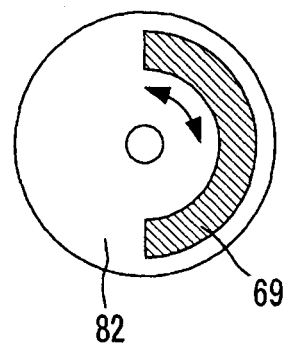
FIG. 13B is a view illustrating a configuration of a rotating electrode portion provided in the rotating mechanism.

As illustrated in FIG. 13B, the rotating electrode portion 82 is formed in a shape of a disk having substantially the same size as that of the base electrode portion 74, and similarly to the base electrode portion 74, an arc-shaped electrode 69 is buried around the center axis.

Next, the knob linking tool 86 is for sandwiching each portion between the rotating base platform 72 and the knob linking tool 86 in a state where the rotating transfer tool 80 is mounted on the rotating supporting tool 78, and is formed in a shape of a substantial disk.

For this reason, when the knob linking tool 86 is mounted in a state where the rotating transfer tool 80 and the rotating supporting tool 78 are nipped, three supporting rollers 75 which abut against an outer circumferential end edge of the knob linking tool 86, and support the knob linking tool 86 to be rotatable are provided on the rotating base platform 72.

At two locations on an outer circumference of the knob linking tool 86, projections 86a and 86b which restrict a rotating range on the rotating base platform 72 of the knob linking tool 86 by being abutted against one of the supporting rollers 75 protrude.

On a side opposite to the rotating transfer tool 80 of the knob linking tool 86, a linking projection 88 for linking a center part of the knob linking tool 86 to the manipulation knob 4 protrudes.

Therefore, if the rotating mechanism 70 is assembled as described above, and the manipulation knob 4 is connected to the rotating mechanism 70 via the linking projection 88 of the knob linking tool 86, regardless of the relative position of the slider 30 with respect to the base 20, the manipulation knob 4 can be rotated around the center axis of the knob linking tool 86.

When the rotating manipulation of the manipulation knob 4 is stopped, the rotating position of the manipulation knob 4 returns to the original reference rotating position by the biasing force of the spring 79 in the rotating supporting tool 78.

Figure 13C:
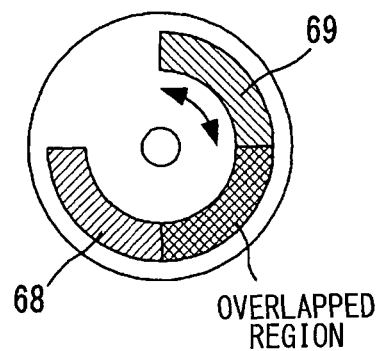
FIG. 13C is a view illustrating a state where the rotating mechanism is assembled and the base electrode portion and the rotating electrode portion are disposed to oppose each other.

Since the arc-shaped electrodes 68 and 69 are respectively buried in the base electrode portion 74 and the rotating electrode portion 82, by assembling the rotating mechanism 70 as described above, parts of the electrodes 68 and 69 can overlap each other (refer to FIG. 13C).

By rotating the manipulation knob 4, an overlapped region illustrated in FIG. 13C, that is, the electrostatic capacity between the electrodes 68 and 69 can be changed.

As illustrated in FIG. 10, in the manipulation device 2 of this embodiment, the electrodes 68 and 69 provided in the base electrode portion 74 and the rotating electrode portion 82, are respectively connected to the signal lines 64a and 64b.

Figure 14:
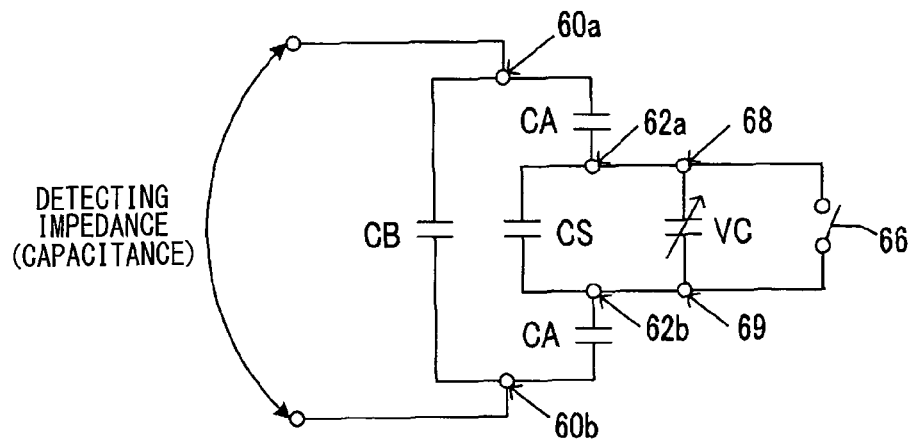
FIG. 14 is a circuit diagram illustrating an equivalent circuit of the manipulation device of the fourth embodiment.

For this reason, as illustrated in FIG. 14, the equivalent circuit inside the manipulation device 2 connects a variable capacitance element VC formed by the electrodes 68 and 69, between the electrodes 62a and 62b in the equivalent circuit (refer to FIG. 4) of the first embodiment.

Therefore, according to the manipulation device 2 of this embodiment, the electrostatic capacity (that is, impedance) measured from the electrodes 60a and 60b on the base 20 side can also be changed by the rotating manipulation of the manipulation knob 4, in addition to the ON and OFF manipulation of the input switch 66.

First Modification Example

In order to change the electrostatic capacity (that is, impedance) measured from the electrodes 60*a* and 60*b* on the base 20 side by the rotating manipulation of the manipulation knob 4, as necessary, it is not necessary to provide the rotating mechanism 70 inside the cover 40, and the rotating mechanism 70 may be provided on the manipulation knob 4 side.

Figure 15:
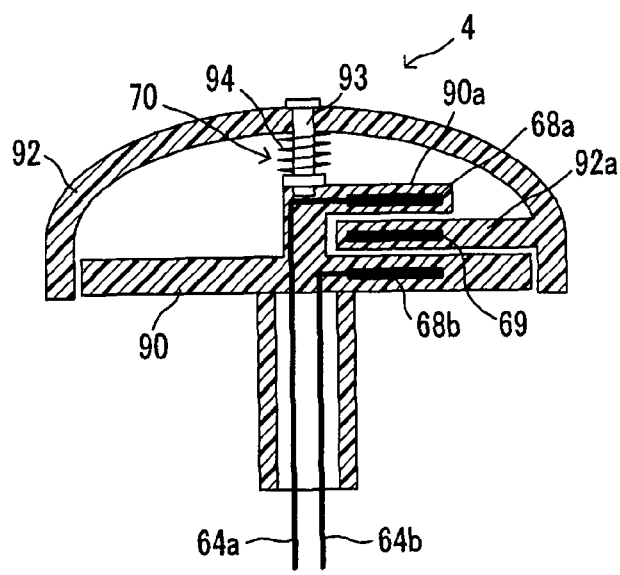
FIG. 15 is a cross-sectional view illustrating First Modification Example of a manipulation knob of the fourth embodiment.

For this reason, for example, as illustrated in FIG. 15, the manipulation knob 4 may be configured of a base portion 90 for linking the manipulation knob 4 to the slider 30, and a cover portion 92 on which the user puts hand, and may be provided with the rotating mechanism 70 between the base portion 90 and the cover portion 92.

In FIG. 15, the rotating mechanism 70 is configured of a linking screw 93 which links the cover portion 92 to the base portion 90 to be rotatable, and a spring 94 which is provided around the linking screw 93, and biases the cover portion 92 in a direction of the reference rotating position. However, the rotating mechanism 70 provided in the manipulation knob 4 may be configured as illustrated in FIGS. 10 to 12.

In this case, as illustrated in FIG. 15, inside the cover portion 92, a rotating electrode portion 92*a* which is disposed parallel to the plate surface of the base portion 90 may be formed, and the electrodes 68 and 69 which are similar to the rotating mechanism 70 illustrated in FIG. 10 may be provided in the rotating electrode portion 92*a* and the base portion 90.

However, in the manipulation knob 4 illustrated in FIG. 15, not only the rotating electrode portion 92*a* is provided in the cover portion 92, but also a base electrode portion 90*a* is provided in the base portion 90 to nip the rotating electrode portion 92*a* between the base electrode portion 90*a* and the base portion 90.

In the base electrode portion 90*a* and the base portion 90, electrodes 68*a* and 68*b* are respectively provided to nip the electrode 69 on the cover portion 92 side.

The signal lines 64*a* and 64*b* are respectively connected to the electrodes 68*a* and 68*b* on the base portion 90 side, and are not connected to the electrode 69 on the cover portion 92 side.

When the manipulation knob 4 is configured in this manner, since the electrostatic capacity between the electrodes 68*a* and 68*b* changes according to the overlapped region between each of the electrodes 68*a* and 68*b*, and the electrode 69 on the cover portion 92 side, the electrostatic capacity between the electrodes 68*a* and 68*b* changes when the manipulation knob 4 is rotated.

Accordingly, even when the manipulation knob 4 is configured as described in FIG. 15, similar effects to those of the fourth embodiment can be obtained.

In FIG. 15, inside the manipulation knob 4, the input switch 66 which is connected to the signal lines 64*a* and 64*b* is not provided, but the electrostatic capacity between the electrodes 62*a* and 62*b* inside the slider 30 can be changed by the rotating manipulation of the manipulation knob 4. For this reason, the input switch 66 may be provided as necessary.

Second Modification Example

However, in First Modification Example, the base electrode portion 90*a* and the rotating electrode portion 92*a* are disposed parallel to the base portion 90 of the manipulation knob 4, and the electrodes 68*a*, 69, and 68*b* are provided in the base electrode portion 90*a*, the rotating electrode portion 92*a*, and the base portion 90 of the manipulation knob 4.

However, since the electrostatic capacity which is connected to the signal lines 64*a* and 64*b* as the variable capacity element VC may change in accordance with the rotating manipulation of the manipulation knob 4, each of the electrodes 68*a*, 69, and 68*b* may be disposed so that the plate surface is not in the direction (generally, the horizontal direction) along the plate surface of the base portion 90, but in the direction (perpendicular direction) which is orthogonal to the plate surface of the base portion 90.

Figure 16A:
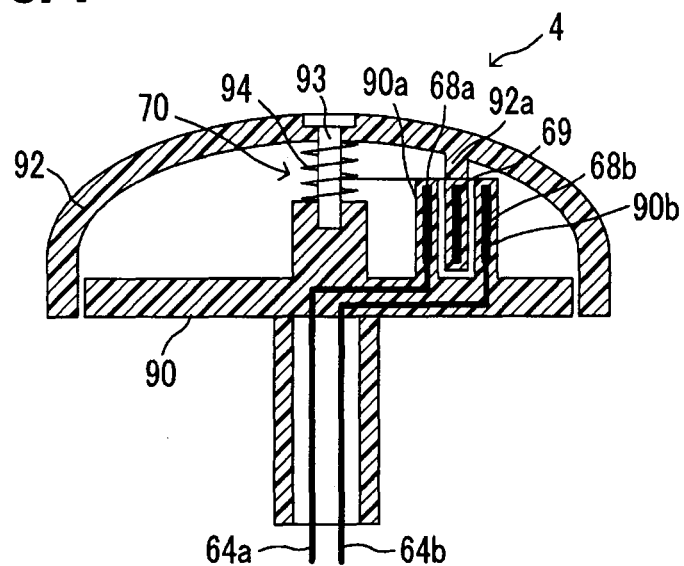
FIG. 16A is a cross-sectional view illustrating Second Modification Example of the manipulation knob of the fourth embodiment.

For this reason, as illustrated in FIG. 16A, the rotating electrode portion 92*a* on the cover portion 92 side may be formed by an arc-shaped wall which suspends downward from a ceiling part of the cover portion 92, one pair of arc-shaped walls may stand as the base electrode portions 90*a* and 90*b* to nip the rotating electrode portion 92*a* in the base portion 90, and the electrodes 68*a*, 69, and 68*b* may be provided in each of the base electrode portions 90*a*, 92, and 90*b*.

Figure 16B:
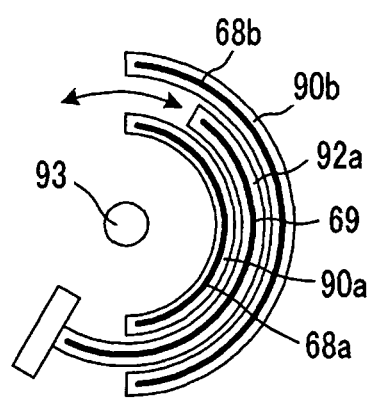
FIG. 16B is a view illustrating a shape of an electrode of Second Modification Example of the manipulation knob of the fourth embodiment.

In Second Modification Example, as illustrated in FIG. 16B, each of the electrode portions 90*a*, 92, and 90*b* is formed to make an angle range of substantially 180 degrees on a concentric circle around the linking screw 93, and the overlapped region between the electrodes 68*a* and 68*b* and the electrode 69 changes as the rotating manipulation is performed with respect to the cover portion 92.

Accordingly, even when the manipulation knob 4 is configured as illustrated in FIGS. 16A and 16B, similar effects to those of the above-described First Modification Example can be obtained.

Third Modification Example

In the fourth embodiment, and in First Modification Example and Second Modification Example, it is described that the overlapped region of the electrodes 68 and 69 disposed to oppose each other changes by the rotating manipulation of the manipulation knob 4, and according to this, the impedance (electrostatic capacity) between the electrodes 62*a* and 62*b* provided in the slider 30 is changed.

In contrast to this, in Third Modification Example, an interval between the electrodes 68 and 69 disposed to oppose each other changes by the rotating manipulation of the manipulation knob 4, and according to this, the impedance (electrostatic capacity) between the electrodes 62*a* and 62*b* provided in the slider 30 is changed.

Figure 17:
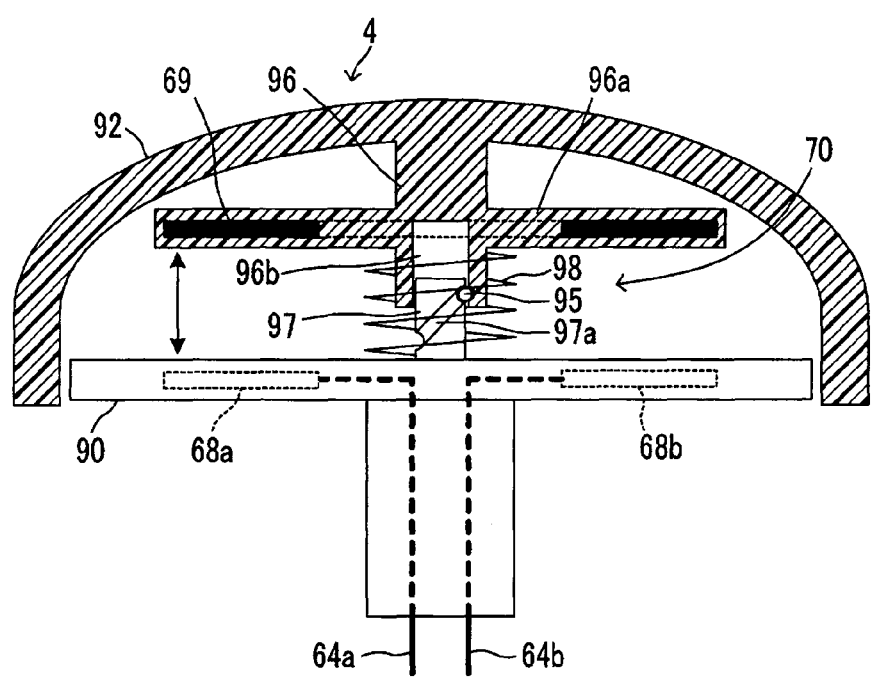
FIG. 17 is a cross-sectional view illustrating Third Modification Example of the manipulation knob of the fourth embodiment.

Specifically, the manipulation knob 4 is configured as illustrated in FIG. 17.

In other words, similarly to First Modification Example and Second Modification Example, the manipulation knob 4 is configured of the base portion 90 and the cover portion 92, the cover portion 92 is formed to have a depth that can accommodate the base portion 90 inside thereof.

A rod-shaped projection 96 which protrudes from the center position which is the center of rotation is provided inside the cover portion 92, and a disk-shaped rotating electrode portion 96*a* is formed at the center of the projection 96 in an axial direction to be widened in an outward direction. In addition, the electrode 69 which has a shape of a hollow disk is provided in the rotating electrode portion 96*a*.

A columnar projection 97 which protrudes toward the cover portion 92 from the center position is provided in the base portion 90. In addition, on the tip end side of the projection 96 provided in the cover portion 92, a circular hole portion 96b for accommodating the projection 97 on the base portion 90 side to be slid is provided.

On a side wall of the projection 97 on the base portion 90 side, a groove 97a is formed to be inclined across the base portion 90 side from the tip end side of the projection. In addition, on the inner wall of the hole portion 96b formed in the projection 96 of the cover portion 92, when the projection 97 on the base portion 90 side is inserted into the hole portion 96b, a recess for sandwiching a ball 95 between the groove 97a and the recess is formed.

For this reason, according to the manipulation knob 4 of Third Modification Example, as the rotating manipulation is performed with respect to the cover portion 92, the position of the ball 95 in the groove 97a changes, and according to this, the cover portion 92 moves in the axial direction of the center of the rotation with respect to the base portion 90.

A spring 98 which biases the base portion 90 in a direction of being separated from the cover portion 92 is provided between the rotating electrode portion 96a of the cover portion 92 and the base portion 90. For this reason, in a state where the rotating manipulation is performed with respect to the cover portion 92, when the user takes off the hand from the cover portion 92, the cover portion 92 returns to the position before the manipulation due to the biasing force of the spring 98.

In other words, in Third Modification Example, the rotating mechanism 70 is formed of the projection 97 on the base portion 90 side, the groove 97a formed in the projection 97, the hole portion 96b formed in the projection 96 on the cover portion 92 side, the ball 95 provided in the recess on the inner wall of the hole portion 96b, and the spring 98.

According to the rotating mechanism 70, the rotating electrode portion 96a can be allowed to approach the base portion 90 by performing the rotating manipulation with respect to the cover portion 92.

In Third Modification Example, in the base portion 90, two electrodes 68a and 68b formed in a shape of an arc are provided to oppose a part of the disk-shaped electrode 69 provided in the rotating electrode portion 96a on the cover portion 92 side, and the electrostatic capacity (that is, impedance) between the electrodes 68a and 68b is changed by the rotating manipulation of the cover portion 92.

Therefore, even when the manipulation knob 4 is configured as described in Third Modification Example, similar effects to those of the fourth embodiment, First Modification Example, and Second Modification Example, can be obtained.

Hereinafter, embodiments and modification examples thereof of this disclosure is described, but this disclosure is not limited to the above-described embodiments and modification examples, and various aspects are possible without departing the scope of main idea of this disclosure.

What is claimed is:

1. A manipulation device, comprising:
   a fixing portion that includes a fixing surface fixed to an object;
   a moving portion that includes a moving surface arranged to face the fixing surface, and is configured such that a relative position of the moving surface with respect to the fixing surface is manually adjusted in a planar direction parallel to the fixing surface;
   a fixing portion side circuit component that is arranged at the fixing portion;
   a moving portion side circuit component that is arranged at the moving portion so as not to be in contact with the fixing portion side circuit component, and includes an electric circuit where an impedance measured from the fixing portion is a predetermined impedance; and
   an input portion that is arranged at the moving portion is manually operable, and changes the impedance of the electric circuit measured from the fixing portion,
   wherein the fixing portion side circuit component and the moving portion side circuit component further include a plurality of pairs of electrodes arranged to face each other by opposing the fixing surface to the moving surface, and
   wherein the input portion further includes a supporting member inside the moving portion that supports a part of the plurality of pairs of electrodes arranged at the moving surface to be detachable from another part of the plurality of pairs of electrodes on the fixing surface.

2. The manipulation device according to claim 1, wherein the input portion arranged at the moving portion which is touchable from outside, and further includes a manipulation electrode connected to at least one pair of electrodes arranged at the moving portion.

3. The manipulation device according to claim 1, wherein the moving portion further includes a pressing lever and a manipulation projection for pressing the pressing lever by manual manipulation.

4. The manipulation device according to claim 1, wherein the input portion includes a switch that switches as to whether a part of the plurality of pairs of electrodes arranged at the moving surface is short-circuited.

5. The manipulation device according to claim 4, wherein the input portion further includes a plurality of switches, and stepwisely changes the impedance of the electric circuit in response to an on state or an off state of each of the plurality of switches.

6. The manipulation device according to claim 1 further comprising:
   a rotating mechanism including a rotating base platform, a rotating supporting tool, a rotating transfer tool and a knob linking tool,
   wherein the rotating base platform includes a triangular shaped base fixed to the moving portion, and
   wherein the knob linking tool contains the rotating supporting tool and the rotating transfer tool between the rotating base platform and the knob linking tool such that the rotating transfer tool is mounted on the rotating supporting tool, forming a generally disk shape.

7. The manipulation device according to claim 6, wherein the rotating supporting tool includes a pair of arms rotatably linked to each other at a first end and separated by a spring at a second end.

8. The manipulation device according to claim 6, wherein the rotating base platform further includes three supporting rollers which abut against an outer circumferential end edge of the knob linking tool, and rotatably support the knob linking tool.

9. A manipulation device, comprising:
   a fixing portion that includes a fixing surface fixed to an object;
   a moving portion that includes a moving surface arranged to face the fixing surface, and is configured such that a relative position of the moving surface with respect to the fixing surface is manually adjusted;
   a fixing portion side circuit component that is arranged at the fixing portion;
   a moving portion side circuit component that is arranged at the moving portion so as not to be in contact with the fixing portion side circuit component, and includes an electric circuit where an impedance measured from the fixing portion is a predetermined impedance; and an input portion that is arranged at the moving portion is manually operable, and changes the impedance of the electric circuit measured from the fixing portion;

wherein the fixing portion side circuit component and the moving portion side circuit component include a plurality of pairs of electrodes arranged to face each other by opposing the fixing surface to the moving surface, wherein the moving portion includes: a moving portion main body having a moving portion circuit component; and a manipulation knob that is rotatable around a predetermined manipulation axis with respect to the moving portion main body, and wherein the input portion includes an impedance variable device that changes the impedance between a part of the plurality of pairs of electrodes arranged at the moving surface in accordance with a rotation of the manipulation knob with respect to the moving portion main body.

10. A manipulation device, comprising:

a fixing portion that includes a fixing surface fixed to an object;

a moving portion that includes a moving surface arranged to face the fixing surface, and is configured such that a relative position of the moving surface with respect to the fixing surface is manually adjusted along the fixing surface;

a fixing portion side circuit component that is arranged at the fixing portion;

a moving portion side circuit component that is arranged at the moving portion so as not to be in contact with the fixing portion side circuit component, and includes an electric circuit where an impedance measured from the fixing portion is a predetermined impedance; and an input portion that is arranged at the moving portion is manually operable, and changes the impedance of the electric circuit measured from the fixing portion, wherein the fixing portion side circuit component and the moving portion side circuit component are provided by a plurality of pairs of electrodes that are arranged to face each other by opposing the fixing surface to the moving surface, and wherein the input portion includes a switch that switches as to whether a part of the plurality of pairs of electrodes arranged at the moving surface is short-circuited.

11. The manipulation device according to claim 10, wherein the relative position of the moving surface with respect to the fixing surface is manually adjusted in a planar direction parallel to the fixing surface.

12. The manipulation device according to claim 10, wherein the input portion further includes a plurality of switches, and stepwisely changes the impedance of the electric circuit in response to an on state or an off state of each of the plurality of switches.

13. The manipulation device according to claim 10, wherein the input portion further includes a supporting member inside the moving portion that supports a part of the plurality of pairs of electrodes arranged at the moving surface to be detachable from another part of the plurality of pairs of electrodes on the fixing surface.

14. The manipulation device according to claim 10, wherein the input portion arranged at the moving portion is touchable from outside, and further includes a manipulation electrode connected to the at least one pair of electrodes arranged at the moving portion.

* * * * *